(12) United States Patent
Shioi

(10) Patent No.: US 7,897,064 B2
(45) Date of Patent: Mar. 1, 2011

(54) OXYNITRIDE-BASED FLUORESCENT MATERIAL AND METHOD FOR PRODUCTION THEREOF

(75) Inventor: Kousuke Shioi, Chiba (JP)

(73) Assignee: Showa Denko K.K., Tokyo (JP)

( * ) Notice: Subject to any disclaimer, the term of this patent is extended or adjusted under 35 U.S.C. 154(b) by 779 days.

(21) Appl. No.: 11/662,399

(22) PCT Filed: Sep. 7, 2005

(86) PCT No.: PCT/JP2005/016882
§ 371 (c)(1), (2), (4) Date: Oct. 9, 2007

(87) PCT Pub. No.: WO2006/028264
PCT Pub. Date: Mar. 16, 2006

(65) Prior Publication Data
US 2008/0048151 A1   Feb. 28, 2008

Related U.S. Application Data

(60) Provisional application No. 60/657,732, filed on Mar. 3, 2005, provisional application No. 60/610,205, filed on Sep. 16, 2004.

(30) Foreign Application Priority Data

Sep. 9, 2004 (JP) ................. 2004-262134
Feb. 21, 2005 (JP) ................. 2005-043809

(51) Int. Cl.
*C09K 11/79* (2006.01)

(52) U.S. Cl. ................................. 252/301.4 F
(58) Field of Classification Search ............ 252/301.4 F, 252/301.36; 313/503, 486; 257/98
See application file for complete search history.

(56) References Cited

U.S. PATENT DOCUMENTS

| 6,717,355 | B2 | 4/2004 | Takahashi et al. | |
| 7,061,024 | B2 * | 6/2006 | Schmidt et al. | 257/98 |
| 7,250,715 | B2 * | 7/2007 | Mueller et al. | 313/485 |
| 7,351,356 | B2 * | 4/2008 | Delsing et al. | 252/301.4 S |
| 2003/0168643 | A1 | 9/2003 | Mitomo et al. | |
| 2006/0076883 | A1 * | 4/2006 | Himaki et al. | 313/503 |

FOREIGN PATENT DOCUMENTS

| EP | 1 413 618 A1 | | 4/2004 |
| JP | 2002-203991 A | | 7/2002 |
| WO | WO 2004/030109 | * | 4/2004 |
| WO | WO 2004/036962 | * | 4/2004 |
| WO | WO 2004/036962 A1 | | 4/2004 |
| WO | WO 2004/039915 | * | 5/2004 |

OTHER PUBLICATIONS

Mukai, et al., "White and Ultraviolet LED", Applied Physics, 1999, pp. 152-154, vol. 68, No. 2.

* cited by examiner

*Primary Examiner* — C. Melissa Koslow
(74) *Attorney, Agent, or Firm* — Sughrue Mion, PLLC

(57) ABSTRACT

A fluorescent material is combined with a blue light-emitting diode or an ultraviolet light-emitting diode and consequently enabled to emit a white light. An oxynitride-based fluorescent material is formed by substituting Eu for part of M in a composition of $MOSi_2N_2O$, wherein M denotes one or more metals selected from among Be, Mg, Ca, Sr and Ba.

3 Claims, 1 Drawing Sheet

F I G. 1
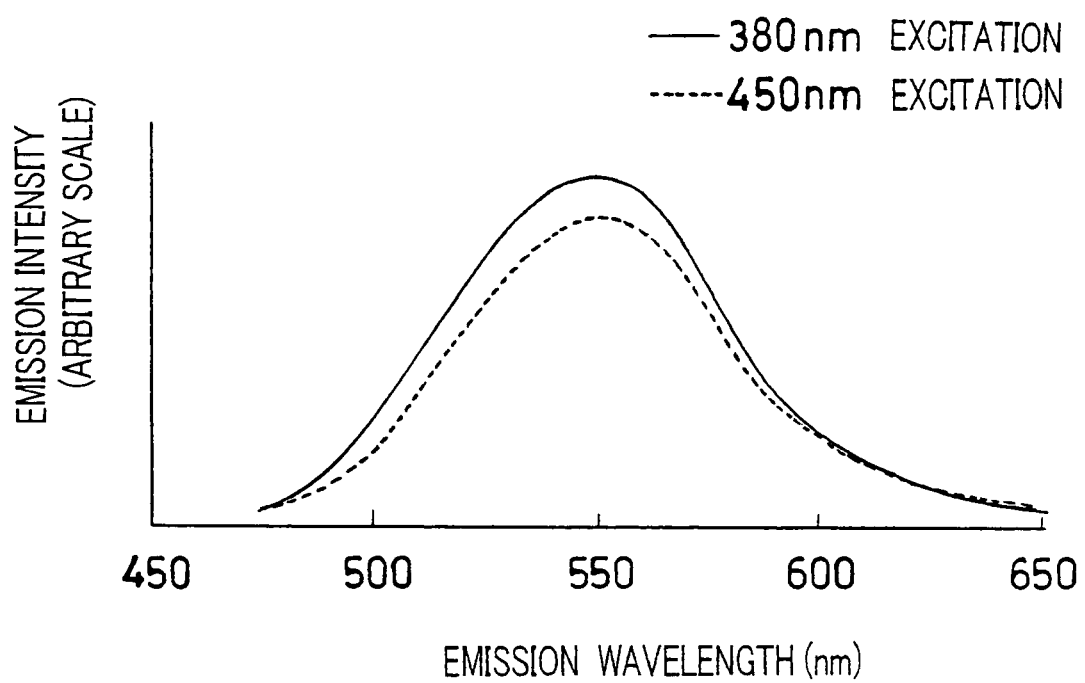

OXYNITRIDE-BASED FLUORESCENT MATERIAL AND METHOD FOR PRODUCTION THEREOF

CROSS REFERENCE TO RELATED APPLICATIONS

This application is an application filed under 35 U.S.C. §111(a) claiming the benefit pursuant to 35 U.S.C. §119(e)(1) of the filing dates of Provisional Applications No. 60/610,205 filed Sep. 16, 2004 and No. 60/657,732 filed Mar. 3, 2005 and Japanese Applications No. 2004-262134 filed Sep. 9, 2004 and No. 2005-043809 filed Feb. 21, 2005 pursuant to 35 U.S.C §111(b).

TECHNICAL FIELD

This invention relates to an oxynitride-based fluorescent material optically activated with a rare earth element. More particularly, this invention relates to an oxynitride-based fluorescent material which allows enhanced luminance to be imparted to a white light-emitting diode (white LED) using a blue light-emitting diode (blue LED) or an ultraviolet light-emitting diode (ultraviolet LED) as a light source.

BACKGROUND ART

The light-emitting diode (LED) is a semiconductor solid-state light-emitting device which results from joining a p-type semiconductor and an n-type semiconductor. The LED is used as the light source for various devices because it possesses strong points, such as long lifetime, excellent resistance to shock, low power consumption and high reliability and permits reduction in volume, thickness and weight. Particularly, the white LED is used for disaster prevention illuminations requiring reliability, on-vehicle illuminations and liquid crystal backlights favoring reduction in volume and weight, and railroad destination guide plates necessitating visibility and is expected to find application to general household room illuminations.

When an electric current is made to flow in the forward direction of the p-n junction formed of a direct transition type semiconductor, the electrons and the positive holes are recombined and the light possessing the peak wavelength corresponding to the forbidden band width of the semiconductor is consequently emitted. Since the emission spectrum of the LED generally has a narrow half width of the peak wavelength, the color of the emission of the white LED is exclusively obtained by the principle concerning the mixture of the colors of the light.

As means to obtain the white color, specifically the following methods have been known.

(1) A method which comprises combining three kinds of LED's individually emitting a red color (R), a green color (G) and a blue color (B), which are the three primary colors of light, and mixing these LED lights, (2) A method which comprises combining an ultraviolet LED emitting an ultraviolet light and three kinds of fluorescent materials individually excited by the ultraviolet light to emit a red color (R), a green color (G) and a blue color (B) respectively and mixing the fluorescences of the three colors emitted from the fluorescence materials, and (3) A method which comprises combining a blue LED emitting a blue color and a fluorescent material excited by the blue color light of the blue LED to emit the fluorescent lights of a blue color and a yellow color which is in the relationship of a complementary color and mixing the LED light in the blue color with the yellow light emitted from the fluorescent material.

The method which obtains a prescribed emission color by using a plurality of LEDs requires a special circuit for adjusting the electric currents of the individual LEDs for the purpose of balancing the component colors. In contrast, the method which obtains a prescribed emission color by combining an LED and a fluorescent material is at an advantage in obviating the necessity for such a circuit and lowering the cost of LED. Thus, various proposals have heretofore been made regarding the fluorescent materials of the kind using an LED as a light source.

For example, a YAG fluorescent material resulting from doping with Ce a YAG-based oxide host crystal represented by the compositional formula $(Y, Gd)_3(Al, Ga)_5O_{12}$ has been disclosed (refer to Takashi Mukai et al, Applied Physics, Vol. 68, No. 2 (1999), pp. 152-155). This literature contains a description to the effect that by coating the first surface of an InGaN-based blue LED chip with a thin layer of a YAG fluorescent material, it is made possible to induce a mixture of a blue light emitted from the blue LED and a fluorescence of a peak wavelength of 550 nm emitted from the YAG fluorescent material owing to the excitation by the blue light and consequently obtain a white light.

A white LED resulting from combining a light-emitting device, such as a nitride-based compound semiconductor capable of emitting an ultraviolet light, and a fluorescent material made to emit light owing to the excitation by the ultraviolet light is also disclosed. As fluorescent materials usable herein, a composition $(Sr, Ca, Ba)_{10}(PO_4)_6Cl_2$:Eu emitting a blue light, a composition $3(Ba, Mg, Mn)0 \cdot 8Al_2O_3$:Eu emitting a green light and a composition $Y_2O_2S$: Eu emitting a red light are disclosed (refer to JP-A 2002-203991).

The existing fluorescent materials generally are at a disadvantage in suffering the spectral intensity to be markedly decreased when the excitation wavelength exceeds the near ultraviolet region.

The white LED obtained by coating the first surface of the InGaN-based blue LED chip with a fluorescent material formed of a YAG-based oxide has been reputed to acquire high luminance with difficulty because the excitation energy of the YAG-based oxide as the fluorescent material and the excitation energy of the blue LED as the light source are not in accord with each other and because the excitation energies are not transformed satisfactorily efficiently.

Further, a white LED formed by combining a light-emitting device, such as a nitride-based compound semiconductor which is capable of emitting an ultraviolet light, and a fluorescent material excited by the ultraviolet light to emit light has been reputed to acquire high luminance with difficulty because it entails the problem that the mixing ratio of the fluorescent material of the red color component is unduly increased because the light-emitting efficiency thereof is appreciably lower than that of the other fluorescent material.

This invention is aimed at providing an oxynitride-based fluorescent material which enables a white light-emitting diode (white LED) using a blue light-emitting diode (blue LED) or an ultraviolet light-emitting diode (ultraviolet LED) as a light source to acquire enhanced luminance and a light-emitting device using the fluorescent material.

The present inventor has pursued a diligent study with a view to accomplishing the above object and has consequently discovered that an oxynitride-based fluorescent material formed by substituting Eu for part of M in the composition represented by the general formula $MOSi_2N_2O$ (provided that M denotes one or more elements selected from among Be, Mg, Ca, Sr and Ba) possesses a strong absorption band in a wide range extending over ultraviolet to near ultraviolet to visible light and has discovered anew that a white LED using the fluorescent material of this invention possesses excellent emission properties. This invention has been perfected as a result.

DISCLOSURE OF THE INVENTION

The present invention provides as the first aspect thereof an oxynitride-based fluorescent material formed by substitution of Eu for part of M in a composition of $MOSi_2N_2O$, wherein M denotes one or more elements selected from among Be, Mg, Ca, Sr and Ba.

The invention also provides as the second aspect thereof an oxynitride-based fluorescent material formed by substitution of Eu for part of M in a composition of $MOSi_2N_2O$, wherein M denotes one or more elements selected from among Ca, Sr and Ba and an atomic ratio of Ca, Sr and Ba (Ca:Sr:Ba) forming M is in a range enclosed with (8:2:0), (6:2:2), (4:4:2), (0:4:6) and (0:10:0).

The invention further provides as the third aspect thereof an oxynitride-based fluorescent material formed by substitution of Eu for part of M in a composition of $MOSi_2N_2O$, wherein M denotes one or more elements selected from among Ca, Sr and Ba and an atomic ratio of Ca, Sr and Ba (Ca:Sr:Ba) forming M is in a range enclosed with (6:4:0), (4:4:2), (2:6:2), (0:6:4) and (0:10:0).

The invention further provides as the fourth aspect thereof an oxynitride-based fluorescent material formed by substitution of Eu for part of M in a composition of $MOSi_2N_2O$, wherein M denotes one or more elements selected from among Ca, Sr and Ba and an atomic ratio of Ca, Sr and Ba (Ca:Sr:Ba) forming M is in a range enclosed with (5.5:4:0.5), (4.5:4:1.5), (2.5:6:1.5), (0.5:6:3.5) and (0.5:9:0.5).

In the fifth aspect of the invention that provides the oxynitride-based fluorescent material according to any one of the first to fourth aspects of the invention, an atomic ratio of Eu/M is in a range of 0.01 to 50 at %.

In the sixth aspect of the invention that provides the oxynitride-based fluorescent material according to any one of the first to fifth aspects of the invention, the oxynitride-based fluorescent material has an average particle diameter of 50 µm or less.

The invention further provides as the seventh aspect thereof a method for the production of the oxynitride-based fluorescent material according to any one of the first to sixth aspects of the invention, comprising the steps of mixing oxides of Be, Mg, Ca, Sr, Ba and Eu or compounds of Be, Mg, Ca, Sr, Ba and Eu capable of forming the oxides on exposure to heat, silicon oxide or a compound capable of forming silicon oxide on exposure to heat, and silicon nitride or a compound capable of forming silicon nitride on exposure to heat to obtain a mixture and firing the mixture in a vacuum or in a non-oxidizable atmosphere at a temperature in a range of 1200 to 1900° C.

The invention further provides as the eighth aspect thereof a method for the production of the oxynitride-based fluorescent material according to any one of the first to sixth aspects of the invention, comprising the steps of mixing oxides of Be, Mg, Ca, Sr, Ba and Eu or compounds of Be, Mg, Ca, Sr, Ba and Eu capable of forming the oxides on exposure to heat, silicon oxide or a compound capable of forming silicon oxide on exposure to heat, and silicon nitride or a compound capable of forming silicon nitride on exposure to heat to obtain a mixture and firing the mixture in the presence of carbon or a carbon-containing compound in a vacuum or in a non-oxidizable atmosphere at a temperature in a range of 1200 to 1900° C.

The invention also provides a light-emitting device combining the oxynitride-based fluorescent material according to any one of the first to sixth aspects of the invention and a light-emitting device.

In the tenth aspect of the invention that provides the light-emitting device according to the ninth aspect of the invention, the light-emitting device is a nitride-based semiconductor light-emitting device and has a wavelength of emission in a range of 250 nm to 500 nm.

The invention further provides as the eleventh aspect thereof a method for the production of the oxynitride-based fluorescent material according to any one of the first to eighth aspects of the invention, comprising the steps of mixing oxides of Be, Mg, Ca, Sr, Ba and Eu or compounds of Be, Mg, Ca, Sr, Ba and Eu capable of forming the oxides on exposure to heat, silicon oxide or a compound capable of forming silicon oxide on exposure to heat, silicon nitride or a compound capable of forming silicon nitride on exposure to heat and a seed of the oxynitride-based fluorescent material that is a final product to obtain a mixture and firing the mixture in a vacuum or in a non-oxidizable atmosphere at a temperature in a range of 1200 to 1900° C.

The invention further provides as the twelfth aspect thereof a method for the production of the oxynitride-based fluorescent material according to any one of the first to eighth aspects of the invention, comprising the steps of mixing oxides of Be, Mg, Ca, Sr, Ba and Eu or compounds of Be, Mg, Ca, Sr, Ba and Eu capable of forming the oxides on exposure to heat, silicon oxide or a compound capable of forming silicon oxide on exposure to heat, silicon nitride or a compound capable of forming silicon nitride on exposure to heat and a seed of the oxynitride-based fluorescent material that is a final product to obtain a mixture and firing the mixture in the presence of carbon or a carbon-containing compound in a vacuum or in a non-oxidizable atmosphere at a temperature in a range of 1200 to 1900° C.

The invention further provides a fluorescent material containing 50% or more of the oxynitride-based fluorescent material according to any one the first to sixth aspects.

The fluorescent material of this invention possesses an absorption band of a wide range extending over ultraviolet to near ultraviolet to visible light and, therefore, can effectively be applied to white LED services using an ultraviolet LED and a blue LED. Further, it can enhance the luminance of the white LED because the absorption band thereof is strong.

The above and other objects, characteristic features and advantages of the present invention will become apparent to those skilled in the art from the description made herein below with reference to the accompanying drawing.

BRIEF DESCRIPTION OF THE DRAWING

FIG. 1 is a graph showing the emission wavelength and the emission intensity which are obtained when the fluorescent material of this invention is excited by using a light-emitting diode.

BEST MODE FOR CARRYING OUT THE INVENTION

The oxynitride fluorescent material of this invention, as described above, is an oxynitride-based fluorescent material formed of what is obtained by substituting Eu for part of M in the composition represented by the general formula MOSi$_2$N$_2$O (provided that M denotes one or more metals selected from among Be, Mg, Ca, Sr and Ba). The compounds of the formulas, BeOSi$_2$N$_2$O, MgOSi$_2$N$_2$O, CaOSi$_2$N$_2$O, SrOSi$_2$N$_2$O, BaOSi$_2$N$_2$O and (Be$_a$, Mg$_b$, Ca$_c$, Sr$_d$, Ba$_e$)OSi$_2$N$_2$O (wherein a+b+c+d+e=1, 0≦a<1, 0≦b<1, 0≦c<1, 0≦d<1 and 0≦e<1) may be cited as concrete examples. Preferable examples are MgOSi$_2$N$_2$O, CaOSi$_2$N$_2$O, SrOSi$_2$N$_2$O, BaOSi$_2$N$_2$O and (Mg$_a$, Ca$_b$, Sr$_c$, Ba$_d$)OSi$_2$N$_2$O (wherein a+b+c+d=1.0, 0≦a<1, 0≦b<1, 0≦c<1 and 0≦d<1).

Particularly for the purpose of emitting a light based on a yellow color, the oxynitride-based fluorescent material formed of what is obtained by substituting Eu for part of M in the composition represented by the general formula MOSi$_2$N$_2$O (wherein M denotes one or more elements selected from among Ca, Sr and Ba) preferably has the atomic ratio of Ca, Sr and Ba forming M (Ca:Sr:Ba) in the range enclosed with (8:2:0), (6:2:2), (4:4:2), (0:4:6) and (0:10:0).

More preferably, in the oxynitride-based fluorescent material formed of what is obtained by substituting Eu for part of M in the composition represented by the general formula MOSi$_2$N$_2$O (wherein M denotes one or more elements selected from among Ca, Sr and Ba), the atomic ratio of Ca, Sr and Ba forming M (Ca:Sr:Ba) is in the range enclosed with (6:4:0), (4:4:2), (2:6:2), (0:6:4) and (0:10:0).

Particularly preferably, in the oxynitride-based fluorescent material formed of what is obtained by substituting Eu for part of M in the composition represented by the general formula MO.Si$_2$N$_2$O (wherein M denotes one or more elements selected from among Ca, Sr and Ba), the atomic ratio of Ca, Sr and Ba forming M (Ca:Sr:Ba) is in the range enclosed with (5.5:4:0.5), (4.5:4:1.5), (2.5:6:1.5), (0.5:6:3.5) and (0.5:9:0.5).

If the atomic ratio deviates from the range mentioned above, this failure will result in preventing the emission from acquiring fully satisfactory intensity and suffering the color of emission to deviate from the color tone based on the yellow color.

The amount of Eu to be used for the substitution is preferably in the range of 0.01 to 50 at % (atom %) based on the metal M. The average particle diameter of Eu is preferably 50 µm or less.

The oxynitride fluorescent material of this invention can be obtained as follows.

The raw material compound which can be used for the oxynitride-based fluorescent material is the oxide of at least one member selected from the group consisting of Be, Mg, Ca, Sr and Ba or the compound of at least one member selected from the group consisting of Be, Mg, Ca, Sr and Ba and enabled by heating to form an oxide. Specifically, beryllium oxide, magnesium oxide, calcium oxide, strontium oxide, barium oxide, beryllium carbonate, magnesium carbonate, calcium carbonate, strontium carbonate, barium carbonate, beryllium hydroxide, magnesium hydroxide, calcium hydroxide, strontium hydroxide, barium hydroxide, beryllium oxalate, magnesium oxalate, calcium oxalate, strontium oxalate, barium oxalate, beryllium sulfate, magnesium sulfate, calcium sulfate, strontium sulfate, barium sulfate, beryllium nitrate, magnesium nitrate, calcium nitrate, strontium nitrate, barium nitrate, beryllium acetate, magnesium acetate, calcium acetate, strontium acetate, barium acetate, dimethoxy beryllium, dimethoxy magnesium, dimethoxy calcium, dimethoxy strontium, dimethoxy barium, diethoxy beryllium, diethoxy magnesium diethoxy calcium, diethoxy strontium, diethoxy barium, dipropoxy beryllium, dipropoxy magnesium, dipropoxy calcium, dipropxy strontium, dipropoxy barium, dibutoxy beryllium, dibutoxy magnesium, dibutoxy calcium, dibutoxy strontium, dibutoxy barium, bis (dipivaloyl methanite)beryllium, bis(dipivaloyl methanite) magnesium, bis(dipivaloyl methanite)calcium, bis(dipivaloyl methanite)strontium and bis(dipivaloy methanite)barium may be cited as concrete examples. These compounds may be used either singly or in the form of a mixture of two or more members. It is permissible to use two or more kinds of mixtures, complex oxides, solid solutions and mixed crystals.

Among other compounds enumerated above, carbonates and hydroxides are preferably used and carbonates are particularly preferably used.

As the raw material compound for Eu, oxides or compounds enabled by heating to form oxides can be used. For example, at least one member selected from among europium oxide, europium carbonate, europium hydroxide, europium oxalate, europium sulfate, europium nitrate, europium acetate, trimethoxy europium, triethoxy europium, tripropoxy europium and tributoxy europium may be used. Two or more kinds of mixtures, complex oxides, solid solutions and mixed crystals can also be used.

Then, as the raw material compound for silicon oxide, silicon oxide or a compound enabled by heating to form silicon oxide can be used. For example, at least one member selected from among silicon dioxide, silicon monoxide, tetramethoxy silane, tetraethoxy silane, tetrapropoxy silane, tetrabutoxy silane and tris(dimethyl amino)silane may be used. Two or more kinds of mixtures, complex oxides, solid solutions and mixed crystals can also be used.

As the raw material for silicon nitride, silicon nitride or compounds enabled by heating to form silicon nitride can be used. For example, at least one member selected from among silicon diimide and polysilazane can be used. Further, the same result can be obtained by optionally mixing at least one compound selected from among silicon, silicon dioxide, silicon monoxide, tetramethoxy silane, tetraethoxy silane, tetrapropoxy silane, tetrabutoxy silane and tris(dimethyl amino) silane with carbon or a compound enabled by heating to form carbon and heating the resultant mixture in nitrogen or in a nitrogen-containing non-oxidizing atmosphere. When the raw material is in a solid state, it is preferably in a pulverized form. Though the particle size of this raw material does not need to be particularly restricted, the raw material in a refined form proves favorable on account of excellence in reactivity. The purity of the raw material is preferably 90% or more.

The method for producing the oxynitride fluorescent material does not need to be particularly restricted. Any of the solid phase method, liquid phase method and vapor phase method can be adopted. The solid phase method, for example, is carried out as follows.

For a start, the raw material compounds are weighed out in necessary proportions and mixed. For this mixing, a ball mill can be used. When the ball mill mixing is selected, while the dry mixing is allowable, the wet mixing by the use of ethanol, acetone or water can be performed. For the purpose of enhancing the reactivity of the raw material powder, the wet mixing proves preferable. Prior to the wet mixing, the produced mixed slurry is dried and then optionally crashed.

Here, the raw material compounds mentioned above may optionally have a flux added thereto and mixed therewith. As the flux, halogenide of an alkali metal or halogenide of an alkaline earth metal is usable. It is added, for example, in an amount in the range of 0.01 to 1 weight part to 100 weight parts of the raw materials for the fluorescent material.

Furthermore, a powdered oxynitride-based fluorescent material synthesized as a seed in advance may be added to and mixed with the raw material compounds, when necessary. In this case, the amount of the seed to be added is in the range of 1 to 50 weight parts to 100 weight parts of the raw materials for the fluorescent material.

The resultant raw material mixture is packed as in a crucible made of alumina, calcia, magnesia, graphite or boron nitride and fired in a vacuum or in a non-oxidizing atmosphere at a temperature in the range of 1200 to 1900° C. for several hours. Optionally, the non-oxidizing atmosphere may be used in a pressed state. The term "non-oxidizing atmosphere" as used herein refers to nitrogen, nitrogen-hydrogen, ammonia, argon, etc.

In the fluorescent material of this invention, europium exhibits ideal emission when it is in the form of plus bivalence. Since the europium oxide which is used as the raw material is trivalent, it must be reduced by the process of firing. The ratio of the bivalence and the trivalence gains in preferability in accordance as the bivalence increases. The ratio of the bivalence to the whole europium is preferably 50% or more. It is more preferably 80% or more. In the fluorescent material of this invention, since europium is added by replacing the site of a bivalent alkaline earth metal, the residue of trivalent europium, if any, will disrupt the balance of electric charge and induce degradation of the intensity of emission. The ratio of the bivalent europium and trivalent europium can be analyzed by the Moessbauer spectroscopy.

When the raw material mixture is fired in the presence of carbon or a carbon-containing compound, the reduction of europium oxide is expedited. The carbon or the carbon-containing compound which is used herein does not need to be particularly restricted but is required to be amorphous carbon, graphite or silicon carbide, for example. It is preferably amorphous carbon or graphite. Carbon black, powdered graphite, activated carbon, powdered silicon carbide, molded products thereof and sinters thereof may be cited as concrete examples. The same effect can be obtained from any of these. As regards the mode of the presence, the case of using a crucible which is made of carbon or a carbon-containing compound, the case of having carbon or a carbon-containing compound disposed inside or outside a crucible which is made of a material other than carbon or a carbon-containing compound, and the case of using a heating unit or an insulating unit which is made of carbon or a carbon-containing compound may be cited as concrete examples. These methods of disposition bring the same effect, no matter which of them may be actually adopted. The carbon or the carbon-containing compound intended for the presence is used appropriately in an amount approximately equimolar to the amount of europium oxide in the raw material mixture when powdered carbon is contained in the raw material mixture and this mixture is fired in an atmosphere of nitrogen, for example.

The product of the firing is cooled, then optionally subjected to a dispersing and pulverizing treatment with a ball mill, further subjected optionally to a treatment of water washing, and passed through the steps of solid-liquid separation, drying, crushing and classification to give rise to the fluorescent material of this invention.

The fluorescent material of this invention is excited fully efficiently with an ultraviolet light or a visible light having a wavelength in the range of 250 nm to 500 nm and, therefore, can be effectively applied to the white LED services using an ultraviolet LED or a blue LED.

It is also allowable to configure a light-emitting device by combining the fluorescent material as a preferred embodiment of this invention with a semiconductor light-emitting device emitting light at a wavelength in the range of 250 nm to 500 nm. Various semiconductors, such as of ZnSe and GaN, may be cited as concrete examples of the light-emitting device contemplated in this case. Though the light-emitting devices which are capable of inducing emission in an emission spectrum of 250 nm to 500 nm are infinitely usable herein, the gallium nitride-based compound semiconductors are preferably used from the viewpoint of efficiency. The light-emitting devices are obtained by forming nitride-based compound semiconductors on a substrate by the MOCVD method or the HVPE method and are preferred to form $In_\alpha Al_\beta Ga_{1-\alpha-\beta} N$ (wherein, $0 \leq \alpha$, $0 \leq \beta$, $\alpha+\beta \leq 1$) as a light-emitting layer. As concrete examples of the structure of semiconductor, the homo structure, hetero structure or double hetero structure possessing a MIS junction, a PIN junction or a p-n junction may be cited. The emission wavelength can be variously selected, depending on the material of the semiconductor layer and the degree of formation of a mixed crystal. Further, the single quantum well structure and the multiple quantum well structure may be configured by forming the semiconductor active layer in the form of a thin film capable of inducing the quantum effect.

The aforementioned fluorescent material layer to be formed on the light-emitting device may be produced by having at least one kind of fluorescent material deposited as a single layer or stacked as a plurality of layers or having a plurality of kinds of fluorescent materials deposited as mixed in a single layer. As regards the manner of disposing the fluorescent material layer on the aforementioned light-emitting device, the mode of having the fluorescent material mixed in a coating member used for covering the first surface of the light-emitting device, the mode of having the fluorescent material mixed in the mold member, the mode of having the fluorescent material mixed in a coating material used for covering the mold member, and the mode of having the fluorescent material mixed in a transparent plate to be disposed in front of the emission side of the LED lamp may be cited as concrete examples.

Further, at least one kind of fluorescent material may be added to the mold member on the aforementioned light-emitting device. Further, at least one kind of the aforementioned fluorescent material layer may be disposed on the outside of the light-emitting diode. As regards the manner of having the fluorescent material disposed on the outside of the light-emitting diode, the mode of having the fluorescent material applied in the form of a layer on the outer surface of the mold member of the light-emitting diode, the mode of manufacturing a molded body having the fluorescent material dispersed in rubber, resin, elastomer or low-melting glass (in the shape of a cap, for example) and coating the LED with the molded body, and the mode of working the aforementioned molded body in the shape of a flat sheet and disposing this flat sheet in front of the LED may be cited as concrete examples.

Also, the mold member may have incorporated therein diffusion agents, such as titanium oxide, titanium nitride, tantalum nitride, aluminum oxide, silicon oxide, barium titanate, germanium oxide, mica, hexagonal boron nitride, or mica coated with white powder of titanium oxide, aluminum oxide, silicon oxide, barium titanate, germanium oxide or hexagonal boron nitride, or hexagonal boron nitride coated with white powder of titanium oxide, aluminum oxide, silicon oxide, barium titanate, germanium oxide, etc.

The oxynitride-based fluorescent material of the present invention is used in the form containing the oxynitride represented by the general formula of the present invention in an amount of 50% or more, preferably 80% or more.

Now, the examples of this invention will be described below. This invention, however, is not limited to these examples. Incidentally, in the following examples, the emission spectrum was determined by using an instrument made by Nippon Bunko K.K. and sold under the product code of "FP-6500."

EXAMPLE 1

As the component raw materials for a fluorescent material, 4.31 g of powdered europium oxide, 14.72 g of powdered silicon oxide, 34.37 g of powered silicon nitride and 46.59 g of powdered calcium carbonate were accurately weighed out and they were uniformly mixed in a ball mill according to the wet method using ethanol. The resultant slurry was dried and crushed to give rise to a raw material mixture. Then, the raw material mixture thus obtained was placed in a crucible made of graphite, disposed in a core tube of a furnace made of alumina and fired in a stream of nitrogen gas at a temperature of 1500° C. for 6 hours. The resultant product of firing was finely pulverized with a ball mill and classified to give rise to a fluorescent material having an average particle diameter of 4.5 μm. When this fluorescent material was assayed with an X-ray diffractometer and an electron beam micro-analyzer, it was confirmed to have a composition $Ca_{0.95}Eu_{0.05}OSi_2N_2O$. When this fluorescent material was made by the excitation at 380 nm to emit light, it was found to emit a yellow light. The emission spectrum of this fluorescent material is shown in FIG. 1. In FIG. 1, the lateral axis forms the scale for the emission wavelength (nm) of the fluorescent material and the vertical axis the scale for the intensity of emission spectrum (arbitrary scale).

EXAMPLE 2

When the fluorescent material obtained in Example 1 was made by the excitation at 450 nm to emit light, it was found to emit a yellow light. The emission spectrum of this fluorescent material is also shown in FIG. 1.

EXAMPLE 3

The fluorescent material obtained in Example 1 was mixed in a ratio of 20 mass % in silicone rubber and the resultant mixture was molded in the shape of a cap by using a heating press. When the cap was made to coat the outer side of a near ultraviolet LED having an emission wavelength of 380 nm and left emitting light, emission of a yellow light was observed. Even after the LED had been kept lighting for 500 hours under the conditions of 60° C. of temperature and 90% of relative humidity (RH), it showed no discernible change ascribable to the fluorescent material.

EXAMPLE 4

When a white LED manufactured by mixing the fluorescent material obtained in Example 1 and the composition $Sr_5(PO_4)_3Cl:Eu$ as a blue light-emitting fluorescent material in respective ratios of 6.1 mass % and 8.8 mass % in the order mentioned in silicon rubber and mounting the resultant mixture on a 380-nm near ultraviolet light-emitting device and a white LED manufactured by mixing a composition $Y_2O_2S:Eu$ as a red light-emitting fluorescent material, a composition $Sr_5(PO_4)_3Cl:Eu$ as a blue light-emitting fluorescent material and a composition $BaMg_2Al_{16}O_{27}:Eu, Mn$ as a green light-emitting fluorescent material in respective ratios of 45.8 mass %, 3.8 mass % and 3.4 mass % in the order mentioned in silicon rubber and mounting the resultant mixture on a 380-nm near ultraviolet light-emitting device were compared, the sample using the fluorescent material obtained in Example 1 and the composition $Sr_5(PO_4)_3Cl:Eu$ as a blue light-emitting fluorescent material was found to acquire a white light having a luminance 2.1 times as high as the other sample.

EXAMPLE 5

When a white LED was manufactured by mixing the fluorescent material obtained in Example 1 in a ratio of 9.1 mass % in an epoxy resin and mounting the resultant mixture on a 450-nm blue light-emitting device, the white light consequently obtained had an emission efficiency of 38 (lm/W).

EXAMPLE 6

A powdered fluorescent material was obtained by following the procedure of Example 1 while accurately weighing out 3.46 g of powdered europium oxide, 11.82 g of powdered silicon oxide, 27.60 g of powdered silicon nitride, 3.74 g of powdered calcium carbonate, 38.63 g of powdered strontium carbonate and 14.75 g of powdered barium carbonate as component raw materials for a fluorescent material. When this fluorescent material was caused by the excitation at 450 nm to emit light, it showed an emission of yellow light. The intensity of the emission obtained at this time was taken as 100.

EXAMPLE 7

A powdered fluorescent material was obtained by following the procedure of Example 1 while accurately weighing out 3.6 g of powdered europium oxide, 12.28 g of powdered silicon oxide, 28.66 g of powdered silicon nitride, 3.89 g of powdered calcium carbonate and 51.58 g of powdered strontium carbonate as component raw materials for a fluorescent material. When this fluorescent material was caused by the excitation at 450 nm to emit light, it showed an emission of yellow light. The intensity of the emission obtained at this time was 78 based on the fluorescent material of Example 6.

EXAMPLE 8

A powdered fluorescent material was obtained by following the procedure of Example 1 while accurately weighing out 3.56 g of powdered europium oxide, 12.16 g of powdered silicon oxide, 28.39 g of powdered silicon nitride, 3.85 g of powdered calcium carbonate, 48.25 g of powdered strontium carbonate and 3.79 g of powdered barium carbonate as component raw materials for a fluorescent material. When this fluorescent material was caused by the excitation at 450 nm to emit light, it showed an emission of yellow light. The intensity of the emission obtained was 96 based on the fluorescent material of Example 6.

EXAMPLE 9

A powdered fluorescent material was obtained by following the procedure of Example 1 while accurately weighing out 3.53 g of powdered europium oxide, 12.04 g of powdered silicon oxide, 28.12 g of powdered silicon nitride, 3.81 g of powdered calcium carbonate, 44.98 g of powdered strontium carbonate and 7.52 g of powdered barium carbonate as component raw materials for a fluorescent material. When this fluorescent material was caused by the excitation at 450 nm to emit light, it showed an emission of yellow light. The intensity of the emission obtained was 98 based on the fluorescent material of Example 6.

EXAMPLE 10

A powdered fluorescent material was obtained by following the procedure of Example 1 while accurately weighing out 3.40 g of powdered europium oxide, 11.60 g of powdered silicon oxide, 27.09 g of powdered silicon nitride, 3.67 g of powdered calcium carbonate, 32.50 g of powdered strontium carbonate and 21.73 g of powdered barium carbonate as component raw materials for a fluorescent material. When this fluorescent material was caused by the excitation at 450 nm to emit light, it showed an emission of yellow light. The intensity of the emission obtained was 97 based on the fluorescent material of Example 6.

EXAMPLE 11

A powdered fluorescent material was obtained by following the procedure of Example 1 while accurately weighing out 3.34 g of powdered europium oxide, 11.40 g of powdered silicon oxide, 26.61 g of powdered silicon nitride, 3.61 g of powdered calcium carbonate, 26.60 g of powdered strontium carbonate and 28.45 g of powdered barium carbonate as component raw materials for a fluorescent material. When this fluorescent material was caused by the excitation at 450 nm to emit light, it showed an emission of yellow light. The intensity of the emission obtained was 89 based on the fluorescent material of Example 6.

EXAMPLE 12

A powdered fluorescent material was obtained by following the procedure of Example 1 while accurately weighing out 3.28 g of powdered europium oxide, 11.20 g of powdered silicon oxide, 26.14 g of powdered silicon nitride, 3.54 g of powdered calcium carbonate, 20.91 g of powdered strontium carbonate and 34.93 g of powdered barium carbonate as component raw materials for a fluorescent material. When this fluorescent material was caused by the excitation at 450 nm to emit light, it showed an emission of yellow light. The intensity of the emission obtained was 78 based on the fluorescent material of Example 6.

EXAMPLE 13

A powdered fluorescent material was obtained by following the procedure of Example 1 while accurately weighing out 3.22 g of powdered europium oxide, 11.00 g of powdered silicon oxide, 25.69 g of powdered silicon nitride, 3.48 g of powdered calcium carbonate, 15.41 g of powdered strontium carbonate and 41.20 g of powdered barium carbonate as component raw materials for a fluorescent material. When this fluorescent material was caused by the excitation at 450 nm to emit light, it showed an emission of yellow light. The intensity of the emission obtained was 45 based on the fluorescent material of Example 6.

EXAMPLE 14

A powdered fluorescent material was obtained by following the procedure of Example 1 while accurately weighing out 3.17 g of powdered europium oxide, 10.82 g of powdered silicon oxide, 25.25 g of powdered silicon nitride, 3.42 g of powdered calcium carbonate, 10.10 g of powdered strontium carbonate and 47.24 g of powdered barium carbonate as component raw materials for a fluorescent material. When this fluorescent material was caused by the excitation at 450 nm to emit light, it showed an emission of yellow light. The intensity of the emission obtained was 39 based on the fluorescent material of Example 6.

EXAMPLE 15

A powdered fluorescent material was obtained by following the procedure of Example 1 while accurately weighing out 3.73 g of powdered europium oxide, 12.75 g of powdered silicon oxide, 29.76 g of powdered silicon nitride, 12.20 g of powdered calcium carbonate and 41.66 g of powdered strontium carbonate as component raw materials for a fluorescent material. When this fluorescent material was caused by the excitation at 450 nm to emit light, it showed an emission of yellow light. The intensity of the emission obtained was 81 based on the fluorescent material of Example 6.

EXAMPLE 16

A powdered fluorescent material was obtained by following the procedure of Example 1 while accurately weighing out 3.70 g of powdered europium oxide, 12.62 g of powdered silicon oxide, 29.47 g of powdered silicon nitride, 11.98 g of powdered calcium carbonate, 38.30 g of powdered strontium carbonate and 3.94 g of powdered barium carbonate as component raw materials for a fluorescent material. When this fluorescent material was caused by the excitation at 450 nm to emit light, it showed an emission of yellow light. The intensity of the emission obtained was 94 based on the fluorescent material of Example 6.

EXAMPLE 17

A powdered fluorescent material was obtained by following the procedure of Example 1 while accurately weighing out 3.66 g of powdered europium oxide, 12.50 g of powdered silicon oxide, 29.18 g of powdered silicon nitride, 11.87 g of powdered calcium carbonate, 35.00 g of powdered strontium carbonate and 7.80 g of powdered barium carbonate as component raw materials for a fluorescent material. When this fluorescent material was caused by the excitation at 450 nm to emit light, it showed an emission of yellow light. The intensity of the emission obtained was 98 based on the fluorescent material of Example 6.

EXAMPLE 18

A powdered fluorescent material was obtained by following the procedure of Example 1 while accurately weighing out 3.62 g of powdered europium oxide, 12.38 g of powdered silicon oxide, 28.89 g of powdered silicon nitride, 11.75 g of powdered calcium carbonate, 31.77 g of powdered strontium carbonate and 11.58 g of powdered barium carbonate as component raw materials for a fluorescent material. When this fluorescent material was caused by the excitation at 450 nm to emit light, it showed an emission of yellow light. The intensity of the emission obtained was 98 based on the fluorescent material of Example 6.

EXAMPLE 19

A powdered fluorescent material was obtained by following the procedure of Example 1 while accurately weighing out 3.59 g of powdered europium oxide, 12.26 g of powdered silicon oxide, 28.61 g of powdered silicon nitride, 11.64 g of powdered calcium carbonate, 28.62 g of powdered strontium carbonate and 15.30 g of powdered barium carbonate as component raw materials for a fluorescent material. When this fluorescent material was caused by the excitation at 450 nm to emit light, it showed an emission of yellow light. The intensity of the emission obtained was 93 based on the fluorescent material of Example 6.

EXAMPLE 20

A powdered fluorescent material was obtained by following the procedure of Example 1 while accurately weighing out 3.52 g of powdered europium oxide, 12.02 g of powdered silicon oxide, 28.07 g of powdered silicon nitride, 11.42 g of powdered calcium carbonate, 22.45 g of powdered strontium carbonate and 22.51 g of powdered barium carbonate as component raw materials for a fluorescent material. When this fluorescent material was caused by the excitation at 450 nm to emit light, it showed an emission of yellow light. The intensity of the emission obtained was 82 based on the fluorescent material of Example 6.

EXAMPLE 21

A powdered fluorescent material was obtained by following the procedure of Example 1 while accurately weighing out 3.46 g of powdered europium oxide, 11.80 g of powdered silicon oxide, 27.55 g of powdered silicon nitride, 11.21 g of powdered calcium carbonate, 16.53 g of powdered strontium carbonate and 29.46 g of powdered barium carbonate as component raw materials for a fluorescent material. When this fluorescent material was caused by the excitation at 450 nm to emit light, it showed an emission of yellow light. The intensity of the emission obtained was 34 based on the fluorescent material of Example 6.

EXAMPLE 22

A powdered fluorescent material was obtained by following the procedure of Example 1 while accurately weighing out 3.39 g of powdered europium oxide, 11.59 g of powdered silicon oxide, 27.05 g of powdered silicon nitride, 11.00 g of powdered calcium carbonate, 10.82 g of powdered strontium carbonate and 36.15 g of powdered barium carbonate as component raw materials for a fluorescent material. When this fluorescent material was caused by the excitation at 450 nm to emit light, it showed an emission of yellow light. The intensity of the emission obtained was 22 based on the fluorescent material of Example 6.

EXAMPLE 23

A powdered fluorescent material was obtained by following the procedure of Example 1 while using a raw material mixture obtained by accurately weighing out 3.46 g of powdered europium oxide, 11.82 g of powdered silicon oxide, 27.60 g of powdered silicon nitride, 3.74 g of powdered calcium carbonate, 38.63 g of powdered strontium carbonate and 14.75 g of powdered barium carbonate as component raw materials for a fluorescent material and uniformly mixing the component raw materials by the dry method using an agate mortar. When this fluorescent material was caused by the excitation at 450 nm to emit light, it showed an emission of yellow light. The intensity of the emission obtained was 76 based on the fluorescent material of Example 6.

COMPARATIVE EXAMPLE 1

A powdered fluorescent material was obtained by following the procedure of Example 1 while using a raw material mixture obtained by accurately weighing out 4.14 g of powdered europium oxide, 28.25 g of powdered silicon oxide, 21.99 g of powdered silicon nitride, 2.21 g of powdered calcium nitride, 30.32 g of powdered strontium nitride and 13.10 g of powdered barium nitride as component raw materials for a fluorescent material, uniformly mixing the component raw materials by the wet method using ethanol in a ball mill, drying the slurry consequently formed and crushing the dried substance. When this fluorescent material was caused by the excitation at 450 nm to emit light, it showed an emission of yellow light. The intensity of the emission obtained was 18 based on the fluorescent material of Example 6.

COMPARATIVE EXAMPLE 2

A powdered fluorescent material was obtained by following the procedure of Example 1 while using a raw material mixture obtained by accurately weighing out 4.14 g of powdered europium oxide, 28.25 g of powdered silicon oxide, 21.99 g of powdered silicon nitride, 2.21 g of powdered calcium nitride, 30.32 g of powdered strontium nitride and 13.10 g of powdered barium nitride as component raw materials for a fluorescent material and uniformly mixing the component raw materials by the dry method using an agate mortar. When this fluorescent material was caused by the excitation at 450 nm to emit light, it showed an emission of yellow light. The intensity of the emission obtained was 43 based on the fluorescent material of Example 6.

COMPARATIVE EXAMPLE 3

A powdered fluorescent material was obtained by following the procedure of Example 1 while accurately weighing out 3.46 g of powdered europium oxide, 11.82 g of powdered silicon oxide, 27.60 g of powdered silicon nitride, 3.74 g of powdered calcium carbonate, 38.63 g of powdered strontium carbonate and 14.75 g of powdered barium carbonate as component raw materials for a fluorescent material, uniformly mixing the component raw materials by the wet method using ethanol in a ball mill, drying the resultant slurry and crushing the dried substance, thereby forming a raw material mixture, placing the raw material mixture in a crucible made of alumina, disposing the crucible in a core tube of a furnace made of alumina, and firing the raw material mixture per se in a stream of nitrogen gas at a temperature of 1500° C. for 6 hours. When this fluorescent material was caused by the excitation at 450 nm to emit light, it showed an emission of yellow light. The intensity of the emission obtained was 51 based on the fluorescent material of Example 6.

COMPARATIVE EXAMPLE 4

A powdered fluorescent material was obtained by following the procedure of Example 1 while accurately weighing out 3.46 g of powdered europium oxide, 11.82 g of powdered silicon oxide, 27.60 g of powdered silicon nitride, 3.74 g of powdered calcium carbonate, 38.63 g of powdered strontium carbonate and 14.75 g of powdered barium carbonate as component raw materials for a fluorescent material, uniformly mixing the component raw materials by the wet method using ethanol in a ball mill, drying the resultant slurry and crushing the dried substance, thereby forming a raw material mixture, placing the raw material mixture in a crucible made of boron nitride, disposing the crucible in a core tube of a furnace made of alumina, and firing the raw material mixture per se in a stream of nitrogen gas at a temperature of 1500° C. for 6 hours. When this fluorescent material was caused by the excitation at 450 nm to emit light, it showed an emission of yellow light. The intensity of the emission obtained was 62 based on the fluorescent material of Example 6.

EXAMPLE 24

A powdered fluorescent material was obtained by following the procedure of Example 1 while accurately weighing out 3.46 g of powdered europium oxide, 11.82 g of powdered silicon oxide, 27.60 g of powdered silicon nitride, 3.74 g of powdered calcium carbonate, 38.63 g of powdered strontium carbonate and 14.75 g of powdered barium carbonate as component raw materials for a fluorescent material, uniformly mixing the component raw materials by the wet method using ethanol in a ball mill, drying the resultant slurry and crushing the dried substance, thereby forming a raw material mixture, placing the raw material mixture in a crucible made of alumina, disposing the crucible together with graphite pieces in a core tube of a furnace made of alumina, and firing the raw material mixture per se in a stream of nitrogen gas at a temperature of 1500° C. for 6 hours. When this fluorescent material was caused by the excitation at 450 nm to emit light, it showed an emission of yellow light. The intensity of the emission obtained was 95 based on the fluorescent material of Example 6.

EXAMPLE 25

A powdered fluorescent material was obtained by following the procedure of Example 1 while accurately weighing out 3.46 g of powdered europium oxide, 11.82 g of powdered silicon oxide, 27.60 g of powdered silicon nitride, 3.74 g of powdered calcium carbonate, 38.63 g of powdered strontium carbonate and 14.75 g of powdered barium carbonate as component raw materials for a fluorescent material, uniformly mixing the component raw materials by the wet method using ethanol in a ball mill, drying the resultant slurry and crushing the dried substance, thereby forming a raw material mixture, placing the raw material mixture together with graphite pieces in a crucible made of alumina, disposing the crucible in a core tube of a furnace made of alumina, and firing the raw material mixture per se in a stream of nitrogen gas at a temperature of 1500° C. for 6 hours. When this fluorescent material was caused by the excitation at 450 nm to emit light, it showed an emission of yellow light. The intensity of the emission obtained was 98 based on the fluorescent material of Example 6.

EXAMPLE 26

A powdered fluorescent material was obtained by following the procedure of Example 1 while accurately weighing out 3.46 g of powdered europium oxide, 11.82 g of powdered silicon oxide, 27.60 g of powdered silicon nitride, 3.74 g of powdered calcium carbonate, 38.63 g of powdered strontium carbonate and 14.75 g of powdered barium carbonate as component raw materials for a fluorescent material, uniformly mixing the component raw materials by the wet method using ethanol in a ball mill, drying the resultant slurry and crushing the dried substance, thereby forming a raw material mixture, placing the raw material mixture in a crucible made of alumina, disposing the crucible in an internally heating type firing furnace using a graphite heater, and firing the raw material mixture per se in a stream of nitrogen gas at a temperature of 1500° C. for 6 hours. When this fluorescent material was caused by the excitation at 450 nm to emit light, it showed an emission of yellow light. The intensity of the emission obtained was 98 based on the fluorescent material of Example 6.

EXAMPLE 27

A powdered fluorescent material was obtained by following the procedure of Example 1 while accurately weighing out 2.97 g of powdered europium oxide, 10.13 g of powdered silicon oxide, 23.66 g of powdered silicon nitride, 63.24 g of powdered barium carbonate as component raw materials for a fluorescent material. When this fluorescent material was caused by the excitation at 450 nm to emit light, it showed an emission of bluish green light. The intensity of the emission obtained was 240 based on the fluorescent material of Example 6.

EXAMPLE 28

A powdered fluorescent material was obtained by following the procedure of Example 1 while accurately weighing out 3.46 g of powdered europium oxide, 11.82 g of powdered silicon oxide, 27.60 g of powdered silicon nitride, 3.74 g of powdered calcium carbonate and 10.00 g of powdered target fluorescent material synthesized in advance as a seed and adopting a firing temperature of 1350° C. When this fluorescent material was caused by the excitation at 450 nm to emit light, it showed an emission of yellow light. The intensity of the emission obtained was 105 based on the fluorescent material of Example 6.

INDUSTRIAL APPLICABILITY

The fluorescent material of this invention is combined as with a blue light-emitting diode to induce emission of a white light. Thus, it can be utilized as a light source for illumination and as a light source for display.

The invention claimed is:

1. A method for the production of the oxynitride-based fluorescent material formed by substitution of Eu for part of M in a composition of $MOSi_2N_2O$, wherein M denotes one or more elements selected from among Be, Mg, Ca, Sr and Ba, comprising the steps of:
   mixing oxides of Be, Mg, Ca, Sr, Ba and Eu or compounds of Be, Mg, Ca, Sr, Ba and Eu capable of forming said oxides on exposure to heat, silicon oxide or a compound capable of forming silicon oxide on exposure to heat, and silicon nitride or a compound capable of forming silicon nitride on exposure to heat to obtain a mixture; and
   firing the mixture in a presence of carbon or a carbon-containing compound in a vacuum or in a non-oxidizable atmosphere at a temperature in a range of 1200 to 1900° C.

2. A method for the production of the oxynitride-based fluorescent material formed by substitution of Eu for part of M in a composition of $MOSi_2N_2O$, wherein M denotes one or more elements selected from among Be, Mg, Ca, Sr and Ba, comprising the steps of:
   mixing oxides of Be, Mg, Ca, Sr, Ba and Eu or compounds of Be, Mg, Ca, Sr, Ba and Eu capable of forming the oxides on exposure to heat, silicon oxide or a compound capable of forming silicon oxide on exposure to heat, silicon nitride or a compound capable of forming silicon nitride on exposure to heat and a seed of the oxynitride-based fluorescent material that is a final product to obtain a mixture and firing the mixture in a vacuum or in a non-oxidizable atmosphere at a temperature in a range of 1200 to 1900° C.

3. A method for the production of the oxynitride-based fluorescent material formed by substitution of Eu for part of M in a composition of $MOSi_2N_2O$, wherein M denotes one or more elements selected from among Be, Mg, Ca, Sr and Ba, comprising the steps of:
   mixing oxides of Be, Mg, Ca, Sr, Ba and Eu or compounds of Be, Mg, Ca, Sr, Ba and Eu capable of forming the oxides on exposure to heat, silicon oxide or a compound capable of forming silicon oxide on exposure to heat, silicon nitride or a compound capable of forming silicon nitride on exposure to heat and a seed of the oxynitride-based fluorescent material that is a final product to obtain a mixture and firing the mixture in the presence of carbon or a carbon-containing compound in a vacuum or in a non-oxidizable atmosphere at a temperature in a range of 1200 to 1900° C.

* * * * *